(12) United States Patent
Cheng et al.

(10) Patent No.: US 10,608,014 B2
(45) Date of Patent: Mar. 31, 2020

(54) BATTERY MANAGEMENT CHIP CIRCUIT ON THE BASE OF SILICON ON INSULATOR (SOI) PROCESS

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Xinhong Cheng, Shanghai (CN); Xinchang Li, Shanghai (CN); Zhonghao Wu, Shanghai (CN); Dawei Xu, Shanghai (CN); Yuehui Yu, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

(*) Notice: Subject to any disclaimer, the term of this patent is extended or adjusted under 35 U.S.C. 154(b) by 0 days.

(21) Appl. No.: 16/085,423

(22) PCT Filed: Jul. 1, 2016

(86) PCT No.: PCT/CN2016/088056
§ 371 (c)(1),
(2) Date: Jan. 28, 2019

(87) PCT Pub. No.: WO2017/156921
PCT Pub. Date: Sep. 21, 2017

(65) Prior Publication Data
US 2019/0157299 A1    May 23, 2019

(30) Foreign Application Priority Data
Mar. 16, 2016  (CN) .......................... 2016 1 0150614

(51) Int. Cl.
*H01L 25/00*  (2006.01)
*H01L 27/12*  (2006.01)
(Continued)

(52) U.S. Cl.
CPC ........ *H01L 27/1203* (2013.01); *H01L 21/761* (2013.01); *H01L 21/76283* (2013.01);
(Continued)

(58) Field of Classification Search
CPC ............. H01L 2924/00; H01L 29/7841; H01L 27/10802; H01L 27/1203
See application file for complete search history.

(56) References Cited

U.S. PATENT DOCUMENTS 6,215,155 B1 * 4/2001 Wollesen ............ H01L 27/1203
257/351
6,404,013 B1 * 6/2002 Chen ................... H01L 27/1203
257/202

(Continued)

FOREIGN PATENT DOCUMENTS

CN    102361031 A    2/2012
CN    105680107 A    6/2016

*Primary Examiner* — Sibin Chen
(74) *Attorney, Agent, or Firm* — Global IP Services; Tianhua Gu

(57) ABSTRACT

A battery management chip circuit on the basis of an SOI process. The battery management chip circuit comprises a high-voltage multiplexer MUX, a voltage reference circuit, a Sigma-delta ADC (comprising an analog modulator and a digital filter), an SPI communication circuit, a function control circuit and a voltage value register. The battery management chip circuit is integrated on the basis of an SOI high-voltage process, and particularly, high-voltage MOS transistors adopted by the battery management chip circuit are high-voltage MOS device units on the basis of the SOI process. In addition, the present invention highlights the design of interface circuit-chopper circuit of the high-volt- (Continued)

age multiplexer MUX and the Sigma-delta ADC, so as to describe the advantages such as decrease of difficulty of circuit design and reduction of layout area brought about when the present invention adopts the SOI process design and tape-out.

8 Claims, 3 Drawing Sheets

(51) Int. Cl.
| | |
|---|---|
| H01M 10/42 | (2006.01) |
| H01L 29/78 | (2006.01) |
| H01L 21/761 | (2006.01) |
| H01L 21/762 | (2006.01) |
| H01L 29/06 | (2006.01) |
| H03K 17/567 | (2006.01) |
| H03K 17/687 | (2006.01) |
| H03K 17/693 | (2006.01) |
| H01L 27/092 | (2006.01) |

(52) U.S. Cl.
CPC .......... *H01L 29/0653* (2013.01); *H01L 29/78* (2013.01); *H01M 10/42* (2013.01); *H01M 10/4257* (2013.01); *H01M 10/4264* (2013.01); *H03K 17/567* (2013.01); *H03K 17/6872* (2013.01); *H03K 17/693* (2013.01); *H01L 27/092* (2013.01); *H01M 2010/4271* (2013.01); *H01M 2220/20* (2013.01)

(56) References Cited

U.S. PATENT DOCUMENTS

| | | | |
|---|---|---|---|
| 2003/0047782 A1* | 3/2003 | Hasegawa | H01L 21/84 257/347 |
| 2012/0256188 A1 | 10/2012 | McDonald et al. | |
| 2012/0292675 A1* | 11/2012 | Roizin | H01L 27/1421 257/290 |

\* cited by examiner

BATTERY MANAGEMENT CHIP CIRCUIT ON THE BASE OF SILICON ON INSULATOR (SOI) PROCESS

CROSS REFERENCE TO RELATED PATENT APPLICATION

The present application is the US national stage of PCT/CN2016/088056 filed on Jul. 1, 2016, which claims the priority of the Chinese patent application No. CN201610150614.7 filed on Mar. 16, 2016, which application is incorporated herein by reference.

BACKGROUND OF THE PRESENT INVENTION

Field of Invention

The present invention relates to a battery management chip circuit, in particular to a battery management chip circuit on the basis of a silicon on insulator (SOI) process.

Description of Related Arts

Electric vehicles will use lithium batteries as main power drive sources in future. A BMS (Battery Management System) is a key part which is used for guaranteeing normal working of lithium batteries and mainly comprises a battery voltage conversion and measurement circuit, a battery balance drive circuit, a switch drive circuit, a current measurement and communication circuit, and corresponding rear-end data processing modules. A schematic block diagram of a common BMS is as illustrated in FIG. 1.

Since BMS generally relates to the field of high voltage (0-60V), the design and manufacture of the chip have quite high requirements for a semiconductor process. At present, the design and manufacture of the BMS chip in the market mostly adopt a high-voltage BCD process, each integrated circuit device unit of the BCD process is prepared by adopting a silicon substrate, high voltage between device units is isolated by adopting PN junctions, and FIG. 2 illustrates a section view of a high-voltage device in a BCD process.

In high-voltage integrated circuit design, this high-voltage device has very strict requirements on voltage of each port of the device, generally speaking, including the following requirements: 1) a PSUB end needs to be connected with GND voltage; 2) an LDWELL end needs to be connected with high voltage (but the high voltage shall not be higher than the maximum isolation voltage value between the LDWELL and the PSUB); 3) voltage of a BULK end shall not be higher than the voltage of the LDWELL and shall be not lower than the maximum value of a reverse isolation voltage of the PN junction; and 4) a SOURCE end, a DRAIN end and a GATE end can be viewed as common MOS devices suspended in a high-voltage well.

According to the above-mentioned introduction, it can be seen that this type of device is a 6-end device in the BCD process. In circuit design, the requirement on the voltage of each port is extremely strict. In particular, both the LDWELL and BULK ports are not commonly used in common processes, voltage values need to be seriously considered in chip design. In case of incomplete consideration or defects in simulation files, simulation software will not report errors, after the chip is taped out, problems of high-voltage leakage and even breakdown will be caused. This is unacceptable for high cost of integrated circuit tape-out.

Accordingly, it is actually necessary to provide a BMS design and manufacturing process which has good isolation performance and fewer device ports.

SUMMARY OF THE PRESENT INVENTION

In view of the above-mentioned disadvantages in the prior art, the purpose of the present invention is to provide a battery managements chip circuit on the basis of an SOI process, which is used for to solve the problem that the battery management chip circuit in the prior art has poor isolation performance, many ports and complicated structure.

In order to realize the above-mentioned purpose and other related purposes, the present invention provides a battery management chip circuit on the basis of an SOI process, and the battery management chip circuit is integrated on the basis of an SOI high-voltage process.

As a preferred solution of the battery management chip circuit on the basis of the SOI process provided by the present invention, high-voltage MOS transistors adopted by the battery management chip circuit are high-voltage MOS device units on the basis of the SOI process.

As a preferred solution of the battery management chip circuit on the basis of the SOI process provided by the present invention, the MOS device unit on the basis of the SOI process comprises: an SOI substrate comprising a silicon substrate, an insulating layer and top layer silicon, an NMOS device or/and a PMOS device being is formed in the top layer silicon; the NMOS device is formed in a P-well region of the top layer silicon and comprises an N+ type source region, an N+ type drain region, a gate electrode structure and a P+ type body region, the P+ type body region and the N+ type source region are isolated by adopting a shallow channel structure; the PMOS device is formed in an N-well region of the top layer silicon and comprises a P+ type source region, a P+ type drain region, a gate electrode structure and an N+ type body region, the N+ type body region and the P+ type source region are isolated by adopting a shallow channel structure.

Further, the MOS device unit on the basis of the SOI process comprises an NMOS device and a PMOS device, and the NMOS device and the PMOS device are isolated by adopting the shallow channel structure.

As a preferred solution of the battery management chip circuit on the basis of the SOI process provided by the present invention, the NMOS device comprises four leading-out ends respectively corresponding to the N+ type source region, the N+ type drain region, the gate electrode structure and the P+ type body region.

As a preferred solution of the battery management chip circuit on the basis of the SOI process provided by the present invention, the PMOS device comprises four leading-out ends respectively corresponding to the P+ type source region, the P+ type drain region, the gate electrode structure and the N+ type body region.

As a preferred solution of the battery management chip circuit on the basis of the SOI process provided by the present invention, the MOS device units on the basis of the SOI process are isolated by adopting a deep trench structure, and the deep trench structure comprises a deep trench at least penetrating through the top layer silicon and an insulating material filled in the deep trench.

As a preferred solution of the battery management chip circuit on the basis of the SOI process provided by the present invention, a working voltage of the battery management chip circuit is 0-60V.

As a preferred solution of the battery management chip circuit on the basis of the SOI process provided by the present invention, the battery management chip circuit comprises an interface circuit of an analog modulator input, and the interface circuit comprises: a first MOS transistor, a second MOS transistor, a third MOS transistor, a fourth MOS transistor, a first diode, a second diode, a first capacitor and a second capacitor integrated on the basis of the SOI process, wherein source ends of the first MOS transistor, the second MOS transistor, the third MOS transistor and the fourth MOS transistor are connected with positive electrodes of the first diode and the second diode and are connected with an input voltage, a gate electrode of the first MOS transistor, a gate electrode of the fourth MOS transistor and a drain electrode of the third MOS transistor are connected with a negative electrode of the first diode and a negative electrode of the first capacitor, and gate electrodes of the second MOS transistor and the third MOS transistor and a drain electrode of the fourth MOS transistor are connected with a negative electrode of the second diode and a negative electrode of the second capacitor, and positive electrodes of the first capacitor and the second capacitor are respectively connected with non-overlapping complementary clock signals; and drain electrodes of the first MOS transistor and the second MOS transistor are respectively used as output ends of the circuit.

As described above, the battery management chip circuit on the basis of the SOI process provided by the present invention has the following beneficial effects:

1) The symmetric high-voltage MOS on the basis of the BCD process is a 6-end device, the corresponding SOI high-voltage device is a 4-end device, which decreases the difficulty and risk of chip design are decreased and reduces the wiring difficulty of layout design is reduced.

2) The deep trench structure in the SOI process is used for isolating each unit on the layout, the trench is an insulating layer and has a strong voltage withstand capability, which occupies smaller chip area relative to PN junction isolation in the BCD process.

3) Trench isolation in the SOI process does not cause leakage current which is caused by PN junction isolation in the BCD process, and the power consumption of the chip is decreased.

4) In addition, the SOI process itself intrinsically has some advantages, including: high temperature is resisted, latching is resisted, and the reliability and stability of the chip are improved; the SOI device can effectively decrease the crosstalk between the devices, has certain radiation resistance and can be applied to fields of higher frequency such that the chip has a wider application field.

DESCRIPTION OF REFERENCE NUMBERS

Figure 1:
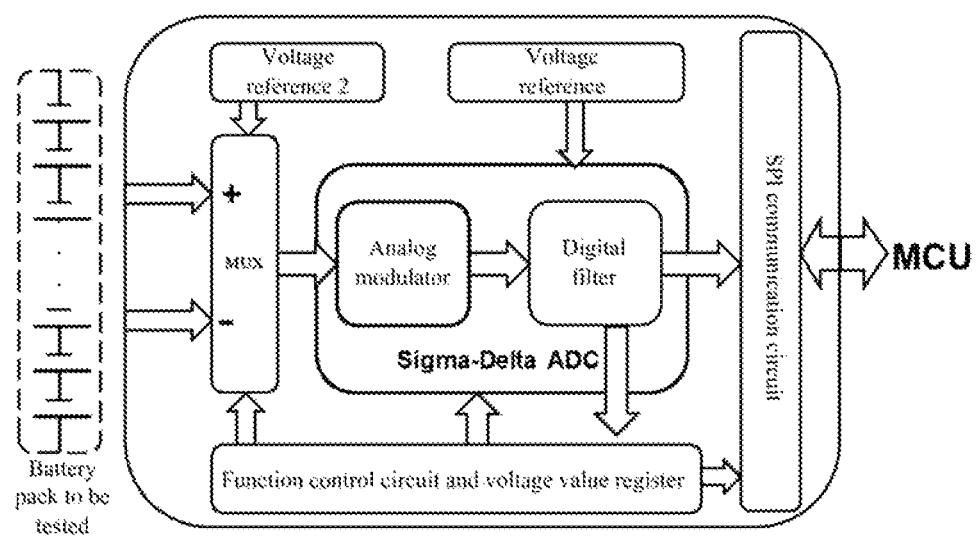
FIG. 1 illustrates a structural block diagram of a battery management chip circuit.

101 Silicon substrate
102 Insulating layer
103 P-well region
104 N+ type source region
105 N+ type drain region
106 Gate electrode structure
107 P+ type body region
108 Shallow channel structure
109 N-well region
110 P+ type source region
111 P+ type drain region
112 Gate electrode structure
113 N+ type body region

DETAILED DESCRIPTION OF THE PREFERRED EMBODIMENTS

The embodiments of the present disclosure will be described below with reference to specific examples. Those skilled in the art can easily understand other advantages and effects of the present disclosure by the contents disclosed in the specification. The present disclosure can also be implemented or applied through other different specific embodiments. The details in the specification can also be on the basis of different viewpoints and applications, and various modifications or changes can be made without departing from the spirit of the present disclosure. Please refer to FIG. 1 and FIG. 3 to FIG. 5. It should be noted that the illustration provided in the embodiments merely illustrates the basic idea of the present disclosure in a schematic manner, only the components related to the present disclosure are shown in the illustration, the components are not drawn in accordance with actual number, shape and dimension, the form, quantity and proportion of the components can be changed freely in actual implementation, and the layout pattern of the components may also be more complicated. As illustrated in FIG. 1 and FIG. 3 to FIG. 5, this embodiment provides a battery management chip circuit on the basis of an SOI process. As illustrated in FIG. 1, the battery management chip circuit comprises a high-voltage multiplexer MUX, a voltage reference circuit, a Sigma-delta ADC (comprising an analog modulator and a digital filter), an SPI communication circuit, a function control circuit and a voltage value register. In this embodiment, the battery management chip circuit is integrated on the basis of an SOI high-voltage process.

As an example, high-voltage MOS transistors adopted by the battery management chip circuit are high-voltage MOS device units on the basis of the SOI process.

Figure 3:
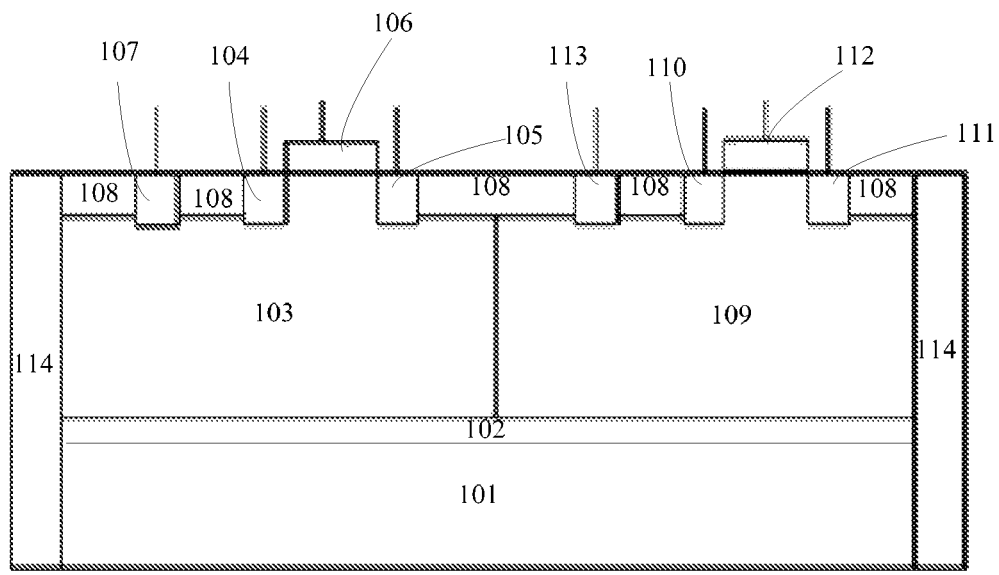
FIG. 3 illustrates a structural schematic view of an MOS device unit on the basis of an SOT process according to the present invention.

As illustrated in FIG. 3, as an example, the MOS device unit on the basis of the SOI process comprises: an SOI substrate, comprising a silicon substrate 101, an insulating layer 102 and top layer silicon; an NMOS device or/and a PMOS device is formed in the top layer silicon; the NMOS device is formed in a P-well region 103 of the top layer silicon and comprises an N+ type source region 104, an N+ type drain region 105, a gate electrode structure 106 and a P+ type body region 107, and the P+ type body region 107 and the N+ type source region 104 are isolated by adopting a shallow channel structure 108; and the PMOS device is formed in an N-well region 109 of the top layer silicon and comprises a P+ type source region 110, a P+ type drain region 111, a gate electrode structure 112 and an N+ type body region 113, and the N+ type body region 113 and the P+ type source region 110 are isolated by adopting a shallow channel structure. As illustrated in FIG. 3, in this embodiment, the MOS device unit on the basis of the SOI process comprises an NMOS device and a PMOS device, and the NMOS device and the PMOS device are isolated by adopting the shallow channel structure 108.

As illustrated in FIG. 3, as an example, the NMOS device comprises four leading-out ends respectively corresponding to the N+ type source region 104, the N+ type drain region 105, the gate electrode structure 106 and the P+ type body region 107.

As illustrated in FIG. 3, as an example, the PMOS device comprises four leading-out ends respectively corresponding to the P+ type source region 110, the P+ type drain region 111, the gate electrode structure 112 and the N+ type body region 113.

As illustrated in FIG. 3, as an example, the MOS device units on the basis of the SOI process are isolated by adopting a deep trench structure 114, and the deep trench structure 114 comprises a deep trench at least penetrating through the top layer silicon and an insulating material filled in the deep trench. Withstand voltage between the isolated high-voltage MOS device units is decided by the withstand voltage of the deep trench structure 114. Since the substrate of the SOI has an insulating layer, a BULK end can be directly connected to a high voltage without considering the problem of withstand voltage as PN junction isolation is adopted in the BCD process.

As an example, a working voltage of the battery management chip circuit is 0-60V.

In one specific implementation process, the battery management chip circuit comprises an interface circuit input by an analog modulator, i.e., an interface circuit between the multiplexer MUX and the Sigma-delta ADC, and the interface circuit comprises: a first MOS transistor M1, a second MOS transistor M2, a third MOS transistor M3, a fourth MOS transistor M4, a first diode D1, a second diode D2, a first capacitor C1 and a second capacitor C2 integrated on the basis of the SOI process, wherein source ends of the first MOS transistor M1, the second MOS transistor M2, the third MOS transistor M3 and the fourth MOS transistor M4 are connected with positive electrodes of the first diode D1 and the second diode D2 and are connected with an input voltage, a gate electrode of the first MOS transistor M1, a gate electrode of the fourth MOS transistor M4 and a drain electrode of the third MOS transistor M3 are connected with a negative electrode of the first diode D1 and a negative electrode of the first capacitor C1, and gate electrodes of the second MOS transistor M2 and the third MOS transistor M3 and a drain electrode of the fourth MOS transistor M4 are connected with a negative electrode of the second diode D2 and a negative electrode of the second capacitor C2, and positive electrodes of the first capacitor C1 and the second capacitor C2 are respectively connected with non-overlapping complementary clock signals CLKB, CLKA; and drain electrodes of the first MOS transistor M1 and the second MOS transistor M2 are respectively used as output ends of the circuit.

Figure 4:
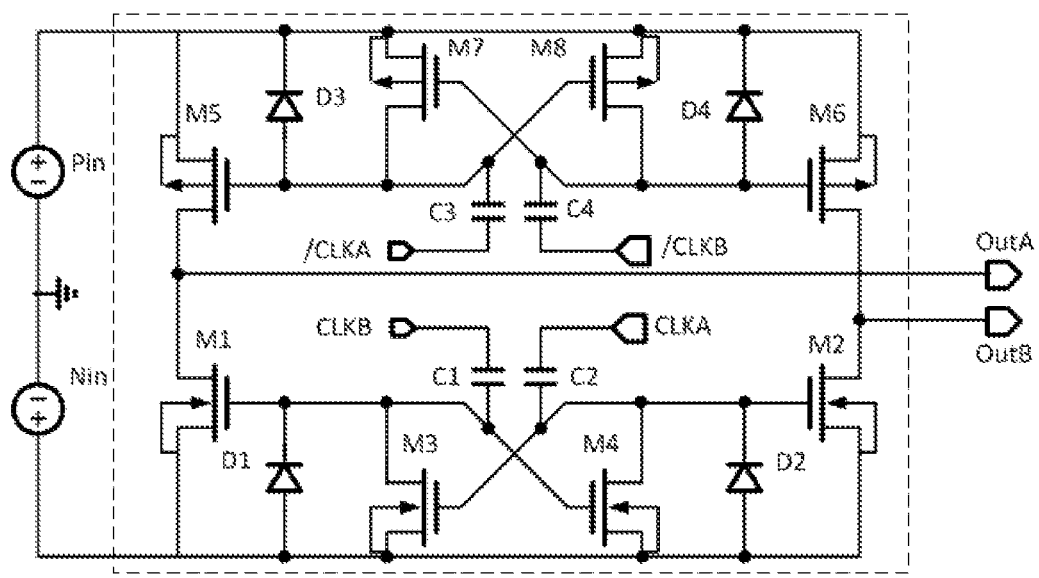
FIG. 4 illustrates a circuit structural schematic diagram of an interface circuit input by an analog modulator according to the present invention.
Figure 5:
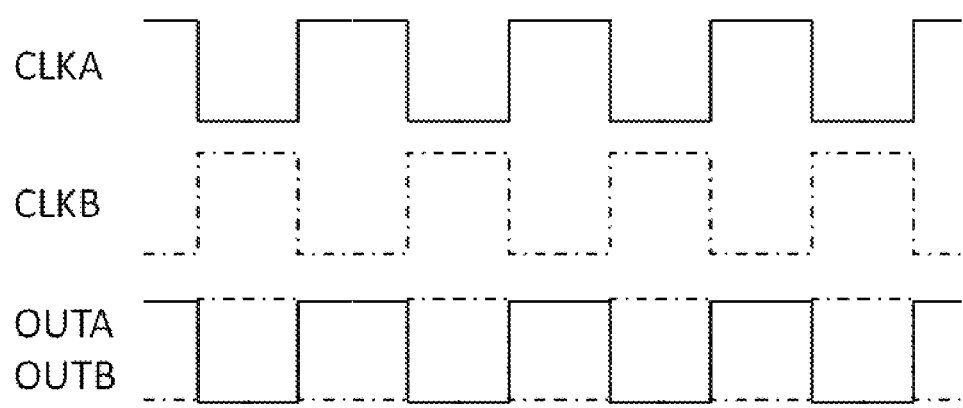
FIG. 5 illustrates a schematic view of simulation results of an interface circuit input by an analog modulator according to the present invention.

In this embodiment, a withstand voltage range of each device in a working process of the chip in FIG. 4 is 0V-60V, i.e., 0V≤Pin≤60V, 0V≤Nin≤60V. Voltage sources Pin and Nin are used for simulating outputs of the multiplexer MUX in FIG. 1. Simulation results of the circuit in FIG. 4 are as illustrated in FIG. 5.

Figure 2:
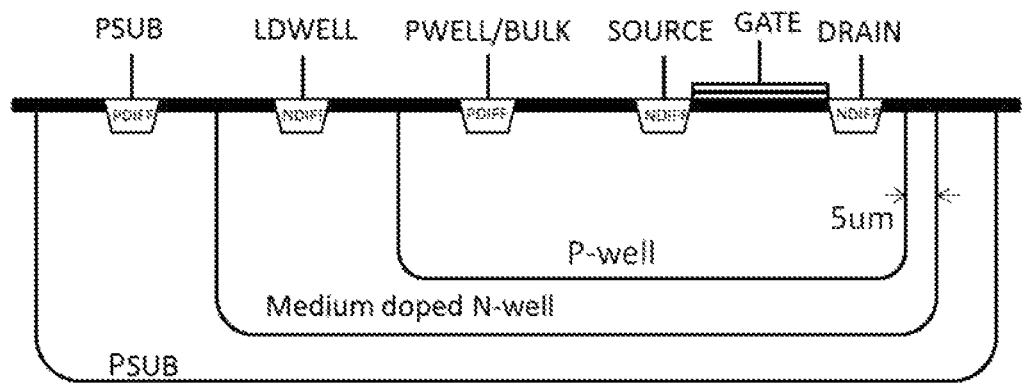
FIG. 2 illustrates a structural schematic view of a high-voltage device prepared on the basis of a BCD process in the prior art.

When Pin=60V and Nin=55V, if the devices M1-M4 adopt the body silicon structure in FIG. 2 and the BULK end is 55V, at this moment, the voltage at the LDWELL end needs to be carefully considered. According to limitation of reverse withstand voltage of PN junction between a P-well and a medium doped N-well (process limitation), it is the best choice to connect the LDWELL with Pin voltage. If M1-M4 adopt SOI process high-voltage devices illustrated in FIG. 3, the voltage at the LDWELL end does not need to be considered, the difficulties of chip design and layout wiring are decreased, and the reliability of chip design is increased. If D1 and D2 are high-voltage diodes, in the BCD process, the N-end also needs a lightly doped N-well for high-voltage isolation; and if the SOI process is adopted, the lightly doped N-well is not needed.

In addition, in the circuit illustrated in FIG. 4, voltage isolation of a BCD high-voltage device usually occupies larger layout area. According to design rules of certain 0.35 μm BCD process library files (as illustrated in FIG. 2), only the smallest size of the LDWELL boundary and the PWELL boundary is 5 μm, which greatly wastes the layout area of the chip and increases the cost. By adopting the SOI process, the overhead of the chip area is avoided and the cost is saved.

According to the basic theory of semiconductor device physics, when there is reverse voltage Vf between two ends of a PN junction, the PN junction in the BCD process will have weak leakage current Is. Reverse current density Js is:

$$J_S = \frac{qD_n n_{p0}}{L_n} + \frac{qD_p p_{n0}}{L_p}$$

In the SOI process, since the insulating layer structure is adopted, there is no leakage phenomenon.

As described above, the battery management chip circuit on the basis of the SOI process provided by the present invention has the following beneficial effects:

1) The symmetric high-voltage MOS on the basis of the BCD process is a 6-end device, the corresponding SOI high-voltage device is a 4-end device, which decreases the difficulty and risk of chip design and reduces the wiring difficulty of layout design.

2) The deep trench structure in the SOI process is used for isolating each unit on the layout, the trench is an insulating layer and has a strong voltage withstand capability, which occupies smaller chip area relative to PN junction isolation in the BCD process.

3) Trench isolation in the SOI process does not cause leakage current which is caused by PN junction isolation in the BCD process, and the power consumption of the chip is decreased.

4) In addition, the SOI process itself intrinsically has some advantages, including: high temperature is resisted, latching is resisted, and the reliability and stability of the chip are improved; the SOI device can effectively decrease the crosstalk between the devices, has certain radiation resistance and can be applied to fields of higher frequency such that the chip has a wider application field.

Therefore, the present invention effectively overcomes various disadvantages in the prior art and thus has a great industrial utilization value.

The above-mentioned embodiments are just used for exemplarily describing the principle and effects of the present invention instead of limiting the present invention. Those skilled in the art may make modifications or changes to the above-mentioned embodiments without departing from the spirit and scope of the present invention. Therefore, all equivalent modifications or changes made by those who have common knowledge in the art without departing from the spirit and technical thought disclosed by the present invention shall be still covered by the claims of the present invention.

What is claimed is:

1. A battery management chip circuit on a basis of a SOI process comprising:
   the battery management chip circuit is integrated on a basis of a SOI high-voltage process and comprises an input interface circuit for an analog modulator;
   the input interface circuit comprises a first MOS transistor, a second MOS transistor, a third MOS transistor, a fourth MOS transistor, a first diode, a second diode, a first capacitor and a second capacitor integrated on the basis of the SOI process, wherein source ends of the first MOS transistor, the second MOS transistor, the third MOS transistor and the fourth MOS transistor are connected with positive electrodes of the first diode and the second diode and are connected with an input voltage, a gate electrode of the first MOS transistor, a gate electrode of the fourth MOS transistor and a drain electrode of the third MOS transistor are connected with a negative electrode of the first diode and a negative electrode of the first capacitor, and gate electrodes of the second MOS transistor and the third MOS transistor and a drain electrode of the fourth MOS transistor are connected with a negative electrode of the second diode and a negative electrode of the second capacitor, and positive electrodes of the first capacitor and the second capacitor are respectively connected with non-overlapping complementary clock signals; and drain electrodes of the first MOS transistor and the second MOS transistor are respectively used as output ends of the circuit.

2. The battery management chip circuit on the basis of the SOI process according to claim 1, wherein high-voltage MOS transistors adopted by the battery management chip circuit are high-voltage MOS device units on the basis of the SOI process.

3. The battery management chip circuit on the basis of the SOI process according to claim 2, wherein the MOS device unit on the basis of the SOI process comprises:
   a SOI substrate, comprising a silicon substrate, an insulating layer and a top layer silicon, a NMOS device or/and a PMOS device is formed in the top layer silicon;
   the NMOS device is formed in a P-well region of the top layer silicon and comprises a N+ type source region, a N+ type drain region, a gate electrode structure and a P+ type body region, the P+ type body region and the N+ type source region are isolated by adopting a shallow channel structure;
   the PMOS device is formed in a N-well region of the top layer silicon and comprises a P+ type source region, a P+ type drain region, a gate electrode structure and a N+ type body region, the N+ type body region and the P+ type source region are isolated by adopting a shallow channel structure.

4. The battery management chip circuit on the basis of the SOI process according to claim 3, wherein the MOS device unit on the basis of the SOI process comprises the NMOS device and the PMOS device, and the NMOS device and the PMOS device are isolated by adopting the shallow channel structure.

5. The battery management chip circuit on the basis of the SOI process according to claim 3, wherein the NMOS device comprises four leading-out ends respectively corresponding to the N+ type source region, the N+ type drain region, the gate electrode structure and the P+ type body region.

6. The battery management chip circuit on the basis of the SOI process according to claim 3, wherein the PMOS device comprises four leading-out ends respectively corresponding to the P+ type source region, the P+ type drain region, the gate electrode structure and the N+ type body region.

7. The battery management chip circuit on the basis of the SOI process according to claim 2, wherein the MOS device units on the basis of the SOI process are isolated by adopting a deep trench structure, and the deep trench structure comprises a deep trench at least penetrating through the top layer silicon and an insulating material filled in the deep trench.

8. The battery management chip circuit on the basis of the SOI process according to claim 1, wherein a working voltage of the battery management chip circuit is 0-60V.

* * * * *